United States Patent
Sultan et al.

(10) Patent No.: US 7,638,837 B2
(45) Date of Patent: Dec. 29, 2009

(54) STRESS ENHANCED SEMICONDUCTOR DEVICE AND METHODS FOR FABRICATING SAME

(75) Inventors: Akif Sultan, Austin, TX (US); Mark Michael, Cedar Park, TX (US); Donna Michael, legal representative, Cedar Park, TX (US); David Wu, Austin, TX (US)

(73) Assignee: GlobalFoundries Inc., Grand Caymen (KY)

( * ) Notice: Subject to any disclaimer, the term of this patent is extended or adjusted under 35 U.S.C. 154(b) by 161 days.

(21) Appl. No.: 11/861,051

(22) Filed: Sep. 25, 2007

(65) Prior Publication Data
US 2009/0078991 A1 Mar. 26, 2009

(51) Int. Cl.
*H01L 27/092* (2006.01)
(52) U.S. Cl. ............... 257/327; 257/338; 257/351; 257/369; 257/E27.062
(58) Field of Classification Search ............... 257/240, 257/287, 341, 401, 327, 338, 351, 369, E27.062
See application file for complete search history.

(56) References Cited

U.S. PATENT DOCUMENTS

| | | | | |
|---|---|---|---|---|
| 7,427,544 B2 * | 9/2008 | Oishi | ............ | 438/197 |
| 7,442,601 B2 * | 10/2008 | Pei et al. | ............ | 438/218 |
| 2003/0040158 A1 * | 2/2003 | Saitoh | ............ | 438/279 |
| 2007/0202652 A1 * | 8/2007 | Moroz et al. | ............ | 438/296 |
| 2009/0057729 A1 * | 3/2009 | Sultan et al. | ............ | 257/288 |

OTHER PUBLICATIONS

Xiang-Zheng Bo et al., "Optimization of Dual-ESL Stressor Geometry Effects for High Performance 65nm SOI Transistors," 2006 IEEE International SOI Conference Proceedings, 2 pages.

* cited by examiner

*Primary Examiner*—Jerome Jackson, Jr.
*Assistant Examiner*—Yu Chen
(74) *Attorney, Agent, or Firm*—Ingrassia, Fisher & Lorenz, P.C.

(57) ABSTRACT

A stress-enhanced semiconductor device is provided which includes a substrate having an inactive region and an active region, a first-type stress layer overlying at least a portion of the active region, and a second-type stress layer. The active region includes a first lateral edge which defines a first width of the active region, and a second lateral edge which defines a second width of the active region. The second-type stress layer is disposed adjacent the second lateral edge of the active region.

17 Claims, 9 Drawing Sheets

STRESS ENHANCED SEMICONDUCTOR DEVICE AND METHODS FOR FABRICATING SAME

TECHNICAL FIELD

The present invention generally relates to semiconductor devices and to methods for their fabrication, and more particularly relates to stress enhanced semiconductor devices and to methods for their fabrication.

BACKGROUND

The majority of present day integrated circuits (ICs) are implemented by using a plurality of interconnected field effect transistors (FETs), also called metal oxide semiconductor field effect transistors (MOSFETs), or simply MOS transistors.

A MOS transistor includes a gate electrode as a control electrode, and a pair of spaced apart source and drain electrodes. A control voltage applied to the gate electrode controls the flow of a drive current through a channel that is established between the source and drain electrodes. When a MOS transistor is operating in its linear region (i.e., when the gate-to-source voltage ($V_{GS}$) is greater than a threshold voltage ($V_{th}$) and the drain-to-source voltage ($V_{DS}$) is less than the difference between the gate-to-source voltage and the threshold voltage ($V_{GS}$-$V_{th}$)), the MOS transistor turns on and a channel is created which allows the drive current to flow between the drain and source. The MOS transistor operates like a resistor, controlled by the gate voltage relative to both the source and drain voltages. The drive current ($I_D$) from drain to source can be modeled in equation (1) as:

$$I_D = \mu C_{ox} \frac{W}{L}\left((V_{GS} - V_{th})(V_{DS}) - \frac{V_{DS}^2}{2}\right) \quad \text{Equation (1)}$$

where $\mu$ is the charge-carrier effective mobility, W is the gate width, L is the gate length and $C_{ox}$ is the gate oxide capacitance per unit area. When the MOS transistor is operating in its saturation region (i.e., when the gate-to-source voltage ($V_{GS}$) is greater than a threshold voltage ($V_{th}$) and the drain-to-source voltage ($V_{DS}$) is greater than the difference between the gate-to-source voltage and the threshold voltage ($V_{GS}$-$V_{th}$)), the MOS transistor turns on and a channel is created which allows the drive current to flow between the drain and source. Since the drain voltage is higher than the gate voltage, a portion of the channel is turned off. The onset of this region is also known as pinch-off. The drain current is now relatively independent of the drain voltage. The drive current ($I_D$) from drain to source is controlled by the gate-to-source voltage ($V_{GS}$) and can be modeled in equation (2) as:

$$I_D = \mu \frac{C_{ox}}{2} \frac{W}{L}(V_{GS} - V_{th})^2. \quad \text{Equation (2)}$$

The complexity of ICs and the number of devices incorporated in ICs are continually increasing. As the number of devices in an IC increases, the size of individual devices decreases. Device size in an IC is usually noted by the minimum feature size; that is, the minimum line width or the minimum spacing that is allowed by the circuit design rules. As the semiconductor industry moves to a minimum feature size of 45 nanometers (nm) and even smaller, the gain of performance due to scaling becomes limited. As new generations of integrated circuits and the MOS transistors that are used to implement those ICs are designed, technologists must rely heavily on non-conventional elements to boost device performance.

As noted above, the performance of a MOS transistor, as measured by its current carrying capability, is proportional to the mobility of a majority carrier in the transistor's channel. By applying an appropriate uniaxial stress to the channel of the MOS transistor, the mobility of the majority carrier in the channel can be increased which increases drive current thereby improving performance of the MOS transistor. For example, applying a compressive uniaxial stress to the channel of a P-channel MOS (PMOS) transistor enhances the mobility of majority carrier holes, whereas applying a tensile uniaxial stress to the channel of an N-channel MOS (NMOS) transistor enhances the mobility of majority carrier electrons. The known stress engineering methods greatly enhance circuit performance by increasing device drive current without increasing device size and device capacitance.

It is desirable to provide improved stress enhanced semiconductor devices and methods for fabricating such stress enhanced semiconductor devices. Furthermore, other desirable features and characteristics of the present invention will become apparent from the subsequent detailed description and the appended claims, taken in conjunction with the accompanying drawings and the foregoing technical field and background.

BRIEF SUMMARY

In accordance with one embodiment, a stress enhanced semiconductor device is provided which includes a substrate comprising an inactive region and an active region, a first-type stress layer overlying the active region, and a second-type stress layer. The active region includes a first lateral edge which defines a first width of the active region, and a second lateral edge which defines a second width of the active region. The first width is greater than the second width. The second-type stress layer is disposed adjacent the second lateral edge and outside the active region.

In accordance with one embodiment, a method of fabricating a stress enhanced semiconductor device is provided. A substrate is provided which includes a layer of semiconductor material, and an active region is defined in the layer of semiconductor material. The active region comprises a first width and a second width that is less than or equal to the first width. A first-type stress layer is deposited overlying the active region, and a second-type stress layer is deposited outside the active region and is spaced apart from the active region.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. The word "exemplary" is used herein to mean "serving as an example, instance, or illustration." Any embodiment described herein as "exemplary" is not necessarily to be construed as preferred or advantageous over other embodiments. All of the implementations described below are exemplary implementations provided to enable persons skilled in the art to make or use the invention and are not intended to limit the scope of the invention which is defined by the claims. Furthermore, there is no intention to be bound by any expressed or implied theory presented in the preceding technical field, background, brief summary or the following detailed description.

A MOS transistor includes an active region which determines an active width of the MOS transistor. With respect to a MOS transistor, drive current is proportional to the active width of the gate electrode and carrier mobility in the channel of the transistor, and is inversely proportional to the length of the gate electrode. To provide different operating currents, portions of the active region can be patterned to provide different active widths for each transistor so that different transistors can generate specific drive currents for corresponding circuits that those transistors are coupled to.

Figure 1:
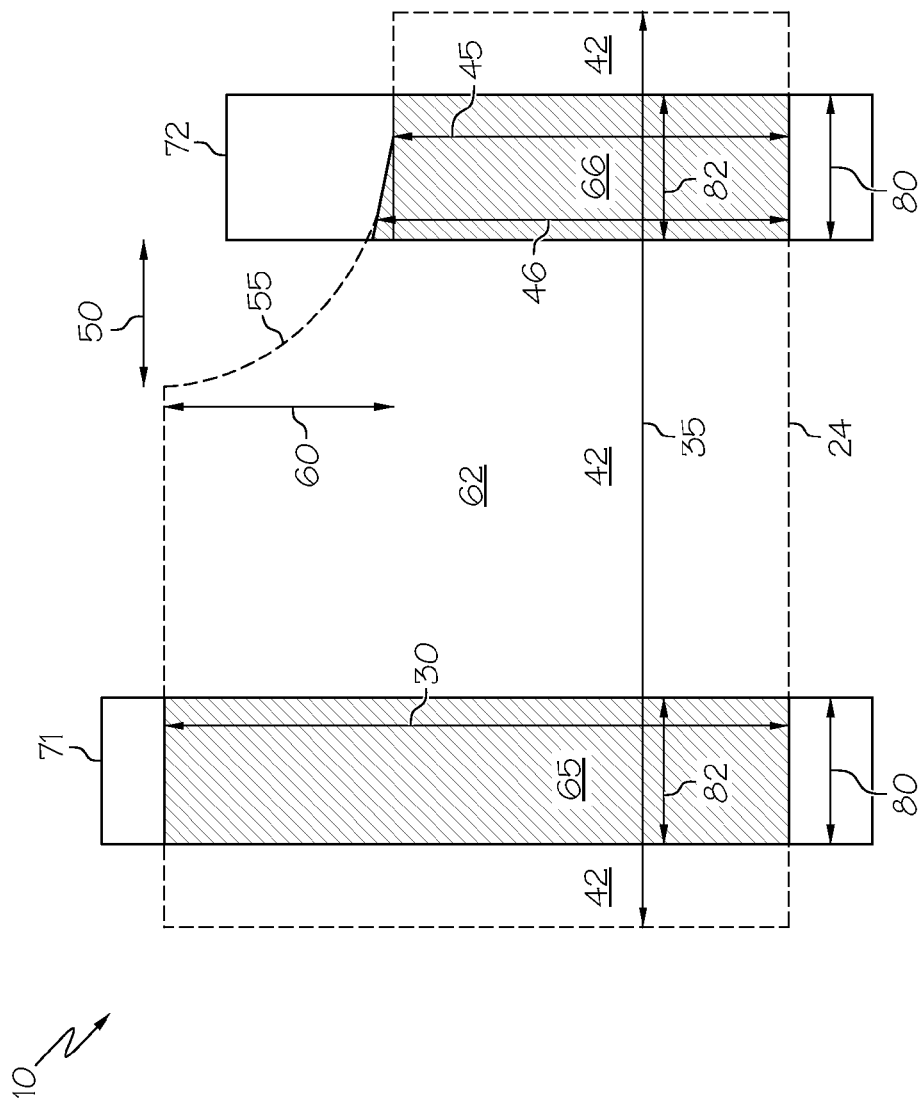
FIG. 1 illustrates a top view of a portion of a PMOS device which exhibits corner rounding in an active region of the semiconductor device.

FIG. 1 illustrates a top view of a portion of a MOS device 10 which exhibits corner rounding in an active region 24 of the MOS device 10. MOS device 10 is formed on and in the active region 24. The active region 24 is defined in a portion of a semiconductor substrate (not shown),has a width 35, and includes a portion 65 having an active width as indicated by double-headed arrow 30 and another portion 66 having an active width as indicated by double-headed arrow 45 which is less than width 30. MOS device 10 includes two series connected MOS transistors each of which comprise a gate electrode 71, 72, source/drain (S/D) regions 42 including a common source/drain (S/D) region 42 formed in a well region 62 that is shared by the two transistors. The S/D regions 42 are adjacent the gate electrodes 71, 72 which overlap or overlie portions 65, 66 of the active region 24 as illustrated in cross-hatching in FIG. 1. Channel regions are defined beneath the gate electrodes 71, 72 between the source/drain (S/D) regions 42 as illustrated by double-headed arrow 82. When a sufficient bias voltage is applied to the gate electrodes 71, 72, a drive current will flow from the source/drain (S/D) region 42 across the channel 82 to the source/drain (S/D) region 42. The drive current capability of the MOS device 10 is inversely proportional to the length 80 of the gate electrodes 71, 72 which defines the channel 82 through which the current flows. The drive current capability of the MOS device 10 is proportional to the active width 30 or 45 of the gate electrode 71, 72, and is proportional to charge-carrier mobility within the channel 82.

To pattern the active region 24 so that it includes the different active widths 30, 45 and hence different drive current capabilities, a layer of photoresist is applied overlying the active region 24 and is patterned to form an etch mask which exposes portions of the active region 24 that will be removed. When portions of the active region 24 are removed during patterning of the active region 24, a phenomenon sometimes referred to as "corner rounding" occurs where rounded corners are formed in the active region 24. This causes a fillet-shaped portion 55 to be formed at a corner of the active region 24 which coincides with the gate electrode 72. The corner rounding effect at the fillet-shaped portion 55 is proportional to the difference 60 between the active width 30 and the active width 45.

Corner rounding is undesirable since it causes variations in the active width (as indicated by double-headed arrows 45, 46) of the MOS device 10 which alters the drive current capability and therefore impacts predictability of device performance. For instance, as illustrated in FIG. 1, a portion of the gate electrode 72 overlies and overlaps the fillet portion 55, and this overlapping can cause variations in the active width 45, 46. As critical dimensions of the MOS device 10 become smaller it becomes increasingly difficult to pattern the active region 24 such that the patterned boundaries of the active region 24 do not exhibit corner rounding effects which alter drive current capability of the MOS device 10.

To address the "corner rounding" problem, one technique is to simply increase the active width 45 of portion 66 of the active region 24. However, this changes the drive current capability and can violate design requirements particularly as critical dimensions of the MOS device 10 are scaled downward. Another technique is to increase the spacing 50 between the gate electrode 72 and the corner of the active region 24 so that the gate electrode 72 does not overlap with the fillet region 55. However, this technique increases overall layout area of the active region 24.

It is desirable to provide an improved semiconductor device which does not suffer from variability caused by corner rounding in an active region, and to provide improved methods for fabricating such a semiconductor device. It is also desirable to provide techniques which can reduce or eliminate the impact of corner rounding in the active region of the semiconductor device without compromising drive current capabilities of the specific transistors of the semiconductor device.

As will be described below, to eliminate the variability in the active width of gate electrodes caused by corner rounding in the active region, drive current capability of a MOS device is decreased by reducing stress applied along the channel which thereby allows the active width to be increased and made more uniform while maintaining drive current capability of the MOS transistor. Any increase in drive current capability associated with increasing the active width of the channel is offset by decreasing stress along the channel of the MOS device. Drive current capability (and gate length) of the MOS device can be maintained without increasing the overall layout area of the MOS device.

Figure 2:
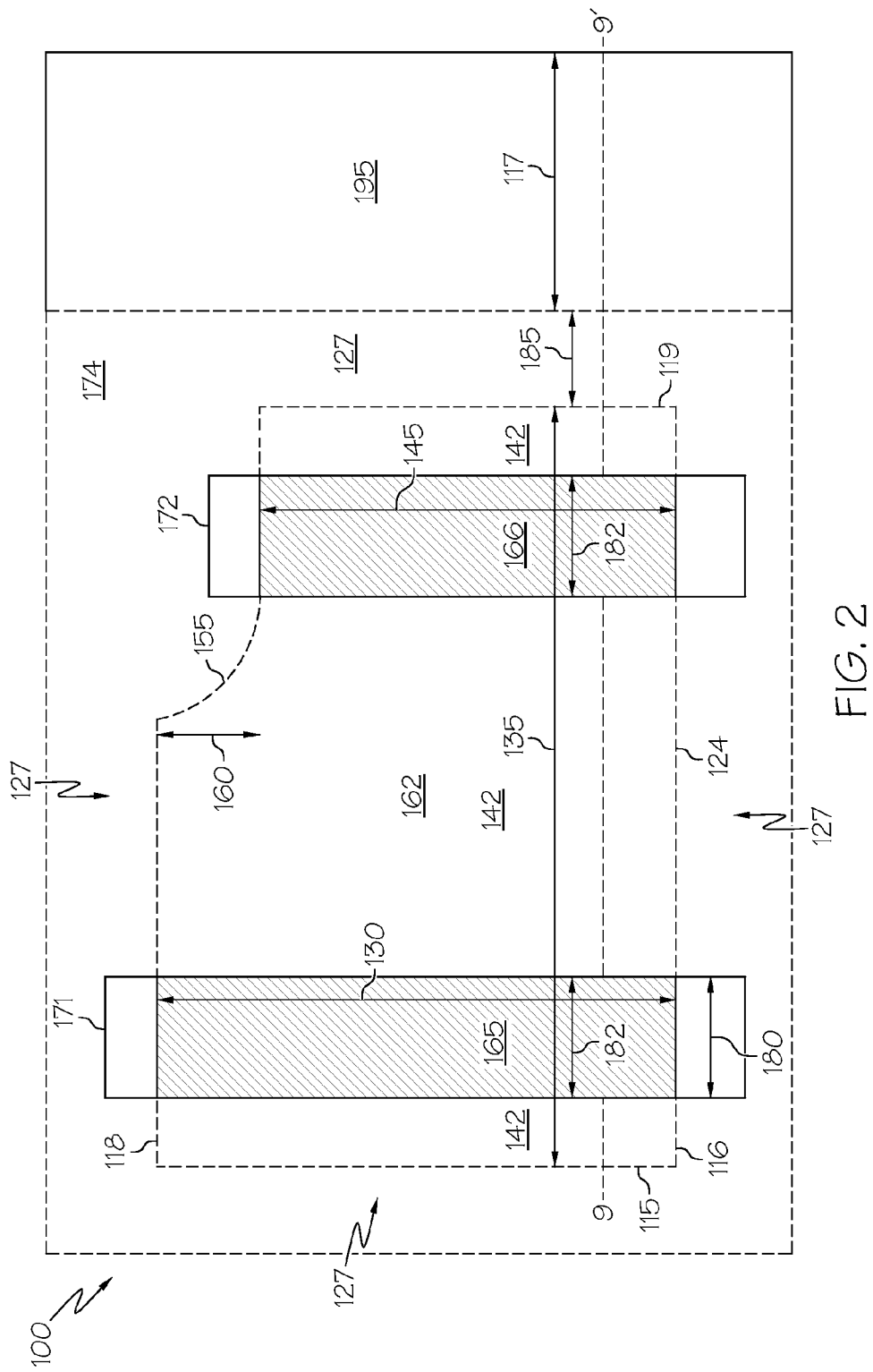
FIG. 2 illustrates a top view of a portion of a stress enhanced PMOS device in accordance with various embodiments of the invention.

FIG. 2 illustrates a top view of a portion of a stress enhanced MOS device 100 in accordance with various embodiments of the invention. The resulting stress enhanced MOS device 100 includes inactive regions 127 and an active region 124.

The active region 124 includes a portion 165 where the gate electrode 171 overlaps the active region 124 which has an active width 130, and another portion 166 where the gate electrode 172 overlaps the active region 124 which has an active width 145. The active region 124 includes a lateral edge 115 which extends along a first lateral dimension of the active region 124 and defines the active width 130, and a lateral edge 119 which extends along a second lateral dimension 145 of the active region 124 and defines the active width 145 of the active region 124. The active width 130 is greater than the active width 145. In one implementation, the active width 130 is between 0.6 μm and 1.0 μm, and the active width 145 is between 0.2 μm and 0.5 μm. The active region 124 also includes a transverse edge 116 which extends along a transverse dimension of the active region 124 and which defines a length 135 of the active region 124, and a transverse edge 118 which extends along another transverse dimension of the active region 124. The transverse edge 118 of the active region 124 has a variable length such that the lateral dimension varies along the lateral edges 115, 119.

As described above, during formation of the active region 124, "corner rounding" occurs which causes a fillet portion 155 to form when the active region 124 is fabricated. The fillet portion 155 is a concave-shaped portion of the active region 124 that is formed between portion 165 and portion 166. The active width 160 of the fillet portion 155 ranges between zero and the difference between the active width 130 and the active width 145. There is less corner rounding as the active width 145 approaches the active width 130 since the fillet portion 155 becomes smaller.

The stress enhanced MOS device 100 includes two series connected transistors, where each of the transistors include a pair of active S/D regions 142 formed in a semiconductor substrate, and a gate electrode 171, 172 formed overlying the semiconductor substrate between the pair of active S/D regions 142. The gate electrodes 171, 172 overlie the portions 165, 166 of the active region 124, respectively. Channel regions 182 are defined beneath the gate electrode 171, 172 between the source/drain (S/D) regions 142 that are adjacent the gate electrodes 171, 172. The drive current capability of each transistor is inversely proportional to the gate length 180 of the gate electrodes 171, 172 which define the respective channels through which the current flows. The drive current capability of each transistor is proportional to the respective active widths 130,145 where the respective gate electrodes 171, 172 overlap and overlie the active region 124.

As noted above, the drive current capability of each transistor of the PMOS device 100 is also proportional to the carrier mobility within the channel. To enhance the drive current capability of each transistor, a first-type stress layer 174 is provided overlying the active region 124 and a portion of the inactive region 127, and a second-type stress layer 195 is provided overlying a portion 117 of the inactive region 127 to decrease stress enhancement provided by the first-type stress layer 174. In this embodiment, because a PMOS device 100 is formed in the active region 124, the first-type stress is a compressive stress, whereas the second-type stress is a tensile stress. In this implementation, the second-type stress layer 195 is disposed adjacent the lateral edge 119 of the active region 124. In this context, term "adjacent" can mean near, in proximity to, beside, bordering, neighboring, close to, next to. The second-type stress layer 195 is spaced apart from the active region 124 by a distance indicated by double-headed arrow 185 so that the second-type stress layer 195 does not overlie the active region 124. In one implementation, the distance 185 is between 0.02 and 0.2 μm.

The second-type stress layer 195 decreases "first-type" stress caused by the first-type stress layer 174 so that the second width 145 can be increased without violating drive current capability of the transistors of the PMOS device 100. By increasing the active width 145 of the active region 124 the size of the fillet 155 is reduced so that the relative percentage of the gate electrode 172 which overlies and overlaps the fillet portion 155 can be reduced and there are less variations in the active width 145 of the MOS device 100 due to corner rounding associated with the fillet portion 155. Ideally, the fillet portion 155 is made small enough so that the gate electrode 172 does not overlap the fillet portion 155 at all. Hence, the active width 145 of the portions of the gate electrode 172 which overlie the active regions 124 are made more uniform.

By decreasing stress in channel 182 defined by gate electrode 172, the drive current capability of the transistor can be reduced. By decreasing channel stress enough, the active width 145 of the gate electrode can be increased so that effects of corner rounding are minimized or eliminated without violating drive current capability of the transistor. In other words, even though increasing the active width 145 would tend to increase drive current capability of the transistor, this increase can be offset by decreasing stress along the channel of the transistor which allows drive current capability of the transistor to be maintained. In addition, the maximum dimension 130 of the active region 124 is not increased and neither is spacing between gate electrodes 171, 172. As such, the overall layout area of the MOS device 100 is also not increased and the gate lengths 182 of the MOS device 100 are kept the same (i.e., are not increased or decreased).

Figure 3:
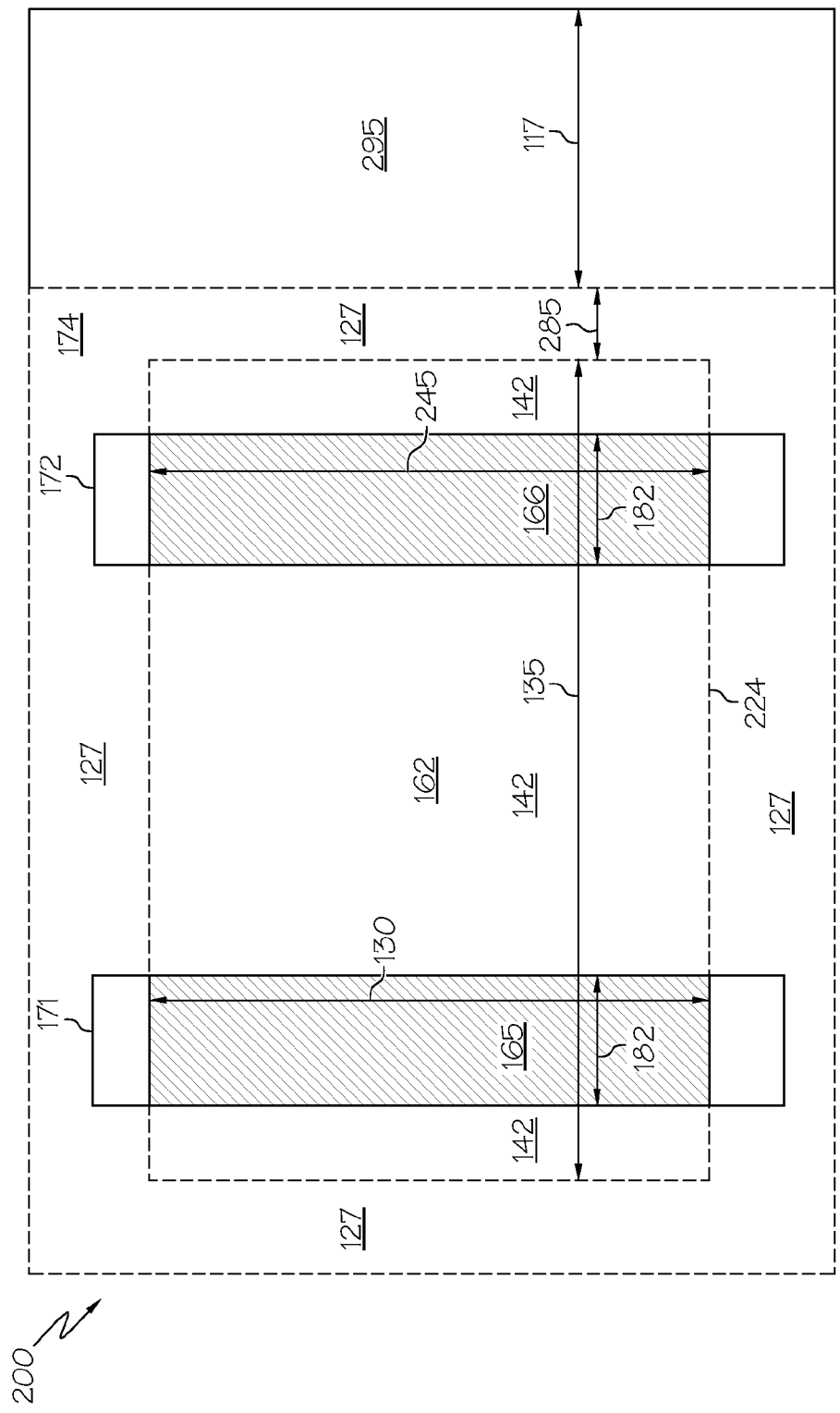
FIG. 3 illustrates a top view of a portion of a stress enhanced PMOS device in accordance with other various embodiments of the invention.

FIG. 3 illustrates a top view of a portion of a stress enhanced semiconductor device 200 in accordance with other various embodiments of the invention. In this embodiment, the stress enhanced MOS transistor 200 is formed in and on the active region 224, and the active width 130 and the active width 245 are approximately equal such that the active corner or "corner rounding" problem is completely eliminated. In contrast to the embodiment illustrated in FIG. 2, the second-type stress layer 295 is spaced closer to the active region 224 by a distance indicated by double-headed arrow 285. The closer proximity of the second-type stress layer 295 to the active region 224 even further decreases first-type stress caused by the first-type stress layer 174 overlying the active region 224 thereby allowing the active width 245 to be made approximately uniform such that it is made substantially equal to the active width 130 thereby completely eliminating the corner rounding problem associated with the fillet-shaped portion.

FIGS. 4-9 illustrate, in cross section, a stress enhanced PMOS device 100 of FIG. 2 and method steps for its fabrication in accordance with various embodiments of the invention. Those of skill in the art will understand that the MOS device 100 can be part of an integrated circuit generally includes a large number of transistors that are interconnected to perform a particular circuit function being implemented. In the illustrative embodiments the exemplary MOS transistor is described as being a P-channel MOS (PMOS) transistor, although similar method steps can be used to manufacture an N-channel MOS (NMOS) transistor as will be explained below. These PMOS and NMOS transistors can be implemented as one transistor that is part of a CMOS device.

Various steps in the manufacture of MOS transistors are well known and so, in the interest of brevity, many conventional steps will only be mentioned briefly herein or will be omitted entirely without providing the well known process details. Although the term "MOS transistor" properly refers to a device having a metal gate electrode and an oxide gate insulator, that term will be used throughout to refer to any semiconductor device that includes a conductive gate electrode (whether metal or other conductive material) that is positioned overlying a gate insulator (whether oxide or other insulator) which, in turn, is positioned overlying a semiconductor substrate (whether silicon or other semiconductor material).

Figure 4:
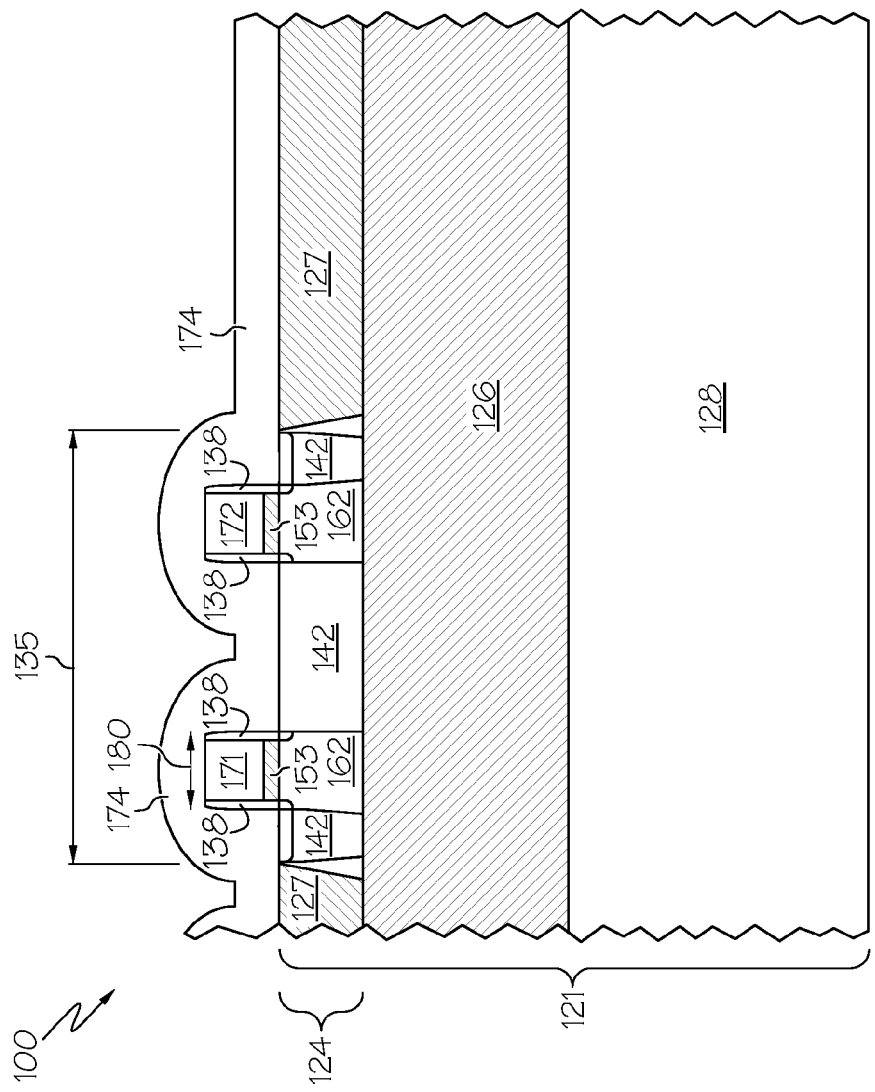
FIGS. 4-9 illustrate, in cross section, the stress enhanced PMOS device of FIG. 2 and method steps for its fabrication in accordance with various embodiments of the invention.

As illustrated in FIG. 4, the manufacture in accordance with an embodiment of the invention begins with providing a semiconductor structure 121 in and on which MOS transistors will be fabricated. The semiconductor structure 121 can be either a bulk semiconductor material or a semiconductor-on-insulator (SOI) structure 121 as illustrated in the embodiment of FIG. 4. The SOI structure 121 illustrated in FIG. 4 comprises at least one thin layer of semiconductor material 124 disposed on or overlying a buried oxide insulating layer 126 which, in turn, is supported by a carrier wafer or substrate 128 so that the buried oxide insulating layer 126 is disposed between the carrier wafer 128 and the semiconductor layer 124. The semiconductor layer 124 can be a thin silicon layer, a germanium layer, a gallium arsenide layer, or other semiconductor materials. In one embodiment, the semiconductor material layer 124 comprises a thin monocrystalline layer of silicon on the buried oxide insulating layer 126. In one embodiment, the buried oxide insulating layer 126 can be, for example, a silicon dioxide layer.

The semiconductor layer 124 can be impurity doped either with N-type conductivity determining impurities or P-type conductivity determining impurities depending on the conductivity type of the MOS transistors being fabricated. In the PMOS embodiment illustrated in FIG. 4, the semiconductor layer 124 is doped with N-type conductivity determining impurities (e.g., dopant ions such as phosphorus and arsenic) to create N-well region 162 in the semiconductor layer 124.

Once the N-well region 162 is formed, inactive regions 127 are formed in the semiconductor layer 124 in portions 127 around or surrounding the active region 124. One process for forming the inactive regions 127 is a shallow trench isolation (STI) process which involves providing an etch mask which selectively exposes portions of the semiconductor layer 124 which correspond to inactive regions and which selectively covers other portions of the semiconductor layer 124 which correspond to the active regions. Shallow trenches are then etched into the surface of the semiconductor layer 124 which are subsequently filled with an insulating dielectric material, such as an oxide ($SiO_2$), and the surface is usually planarized, for example, by chemical mechanical planarization (CMP).

A layer of gate insulating material 153 is formed overlying the impurity-doped N-well region 162 and gate electrodes 171, 172 are formed overlying the gate insulating material 153 and impurity-doped N-well region 162, respectively. Sidewall spacers 138 are formed on the sidewalls of the various gate electrodes 171, 172, for example, by depositing a layer of insulating material such as silicon oxide and/or silicon nitride and subsequently anisotropically etching the insulating layer, for example by reactive ion etching (RIE). A layer of masking material, which can be, for example, a layer of photoresist, is applied and patterned to expose portions of N-well region 162. Using this layer of patterned mask material as an ion implantation mask, P-type conductivity determining ions, such as boron ions, are implanted into exposed portions of the gate electrodes 171, 172 and into the exposed portions of N-well region 162 to form P-type S/D regions 142.

At this stage of processing, the PMOS device 100 includes two PMOS transistors coupled in series, each of which include a pair of active S/D regions 142 formed in the semiconductor substrate 124 and a gate electrode structure formed on the semiconductor substrate 124. Each of the gate electrode structures comprises a gate insulator layer 153, a gate electrode 171, 172 overlying gate insulator layer 153, and spacers 138 adjacent a first sidewall and a second sidewall of the gate electrodes 171, 172.

Figure 5:
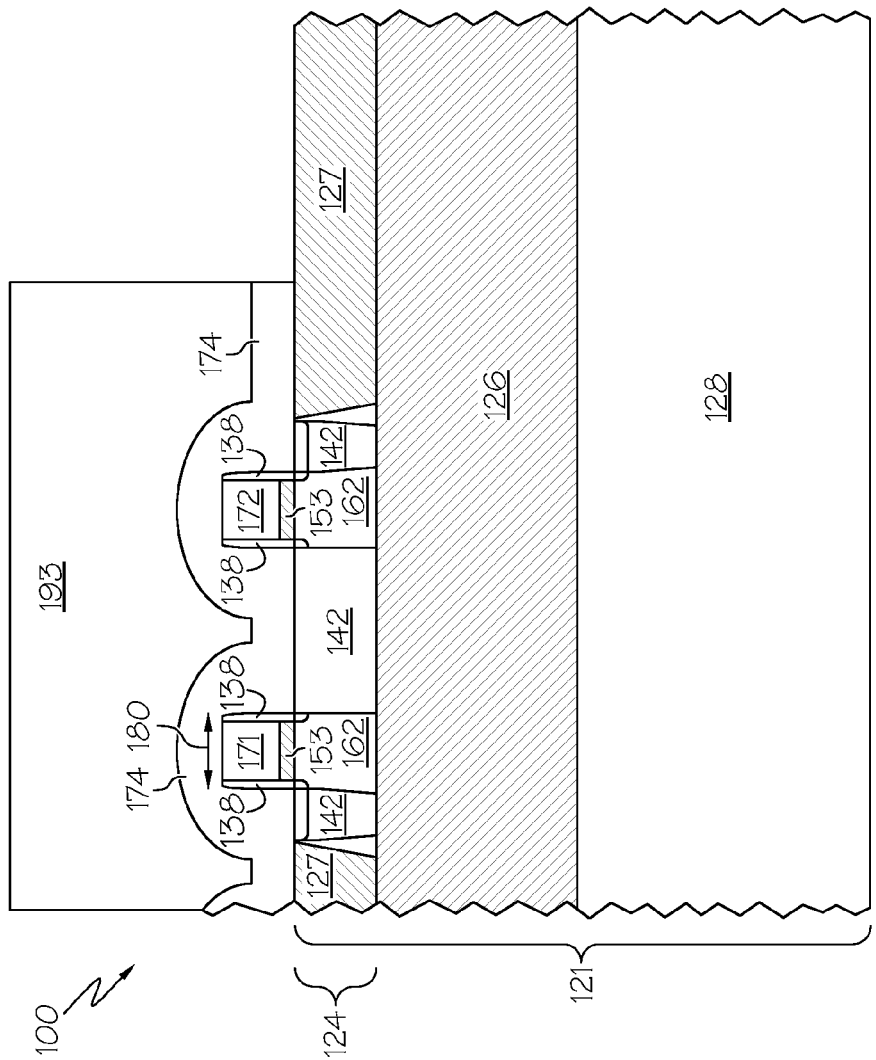
Figure 6:
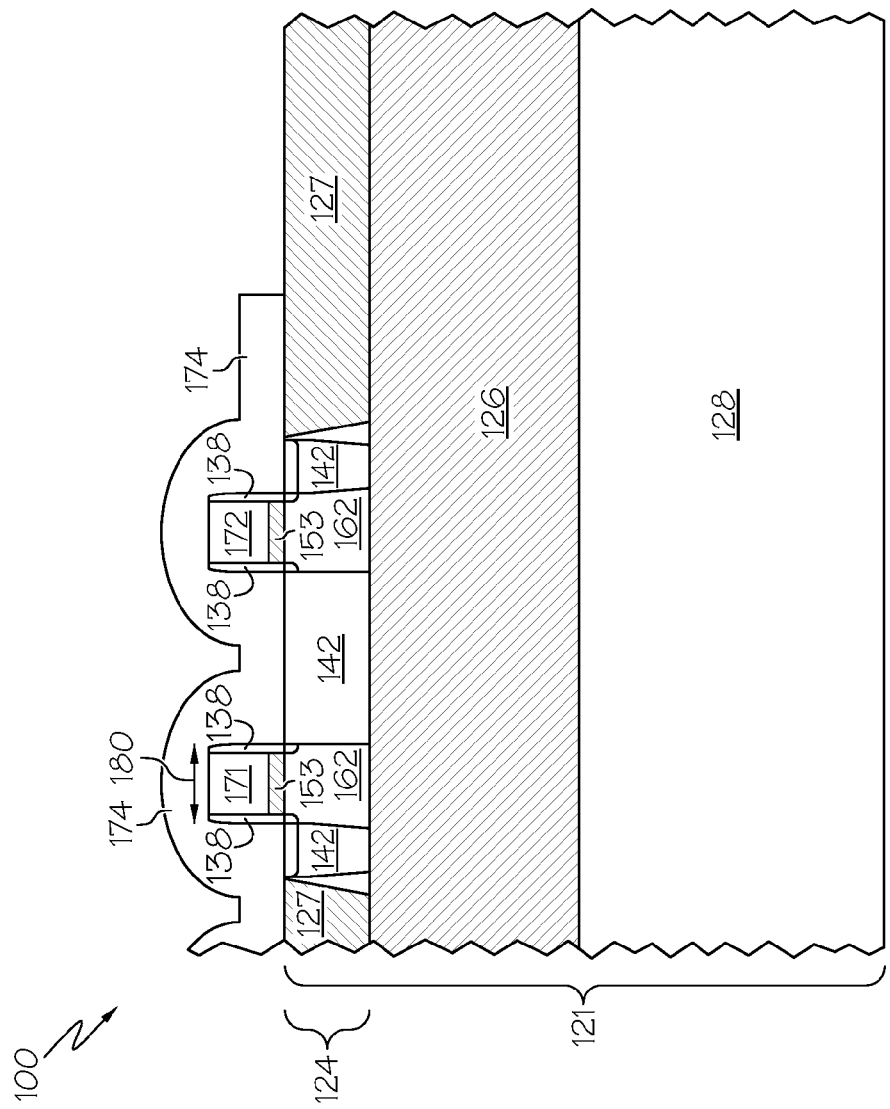

To improve performance of the PMOS device 100, stress along a channel region of the PMOS device 100 is enhanced by conformally depositing an appropriate stress layer 174 of a first stress-type. In this embodiment, because a PMOS device 100 is being formed, the first-type stress is a compressive stress. The compressive stress layer 174 can be formed of an electrically insulating material, such as, a layer of stressed silicon nitride (SiN). As illustrated in FIG. 5, a layer of masking material 193, which can be, for example, a layer of photoresist, is applied and patterned to form a patterned mask 193 which exposes portions the compressive stress layer 174. Using this layer of patterned mask material 193 as an etch mask, the exposed portion of the compressive stress layer 174 is then patterned to remove at least some portions of the compressive stress layer 174 which overlie the inactive region 127. After removing the layer of patterned mask material 193, the resulting structure is illustrated in FIG. 6.

Figure 7:
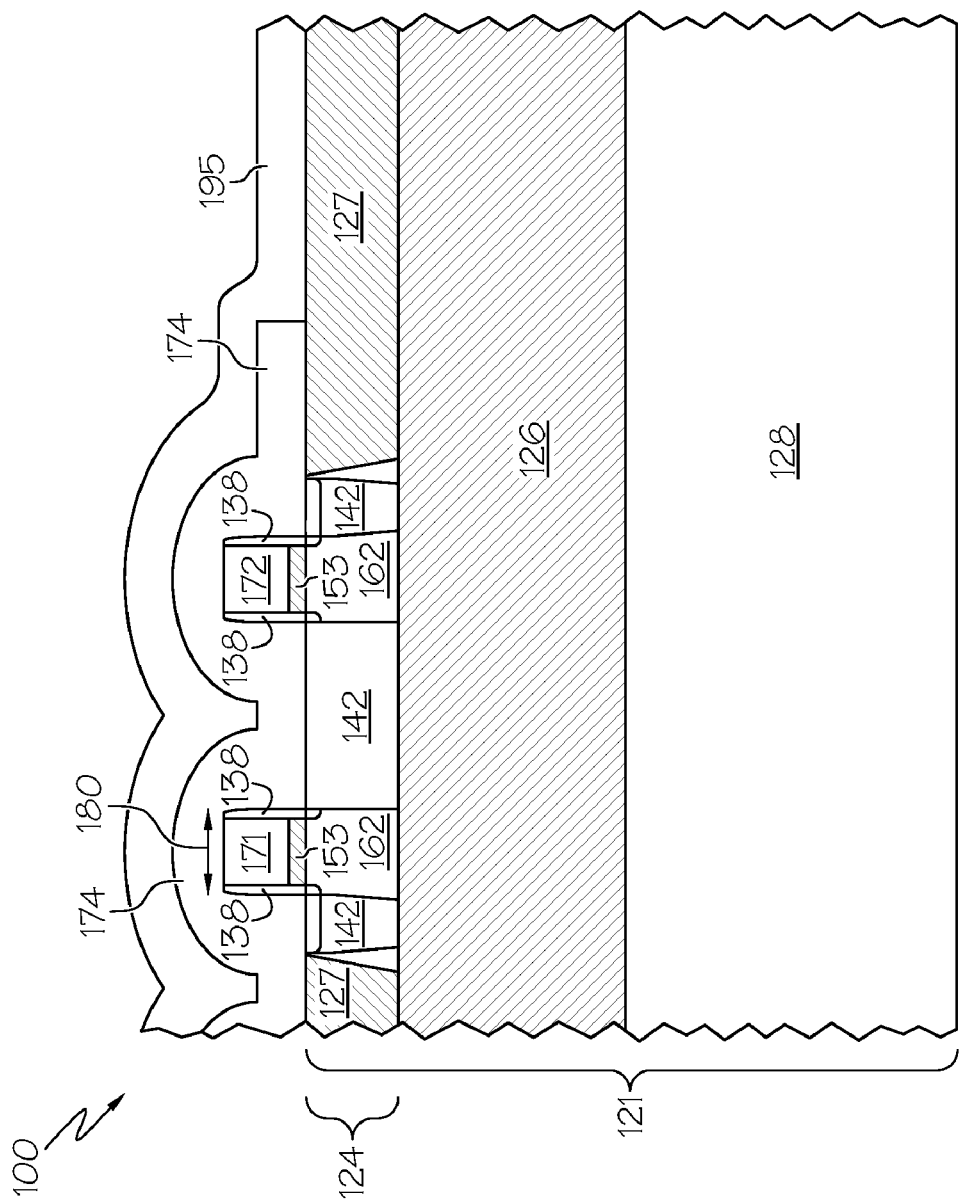

As illustrated in FIG. 7, a second stress-type layer 195 having a second stress-type is deposited overlying the remaining portions of the compressive stress layer 174 and the exposed portion of the inactive region 127. The second stress-type layer 195 has an opposite stress-type in comparison to that of stress layer 174. Therefore, in this embodiment, the second-type stress is a tensile stress.

Figure 8:
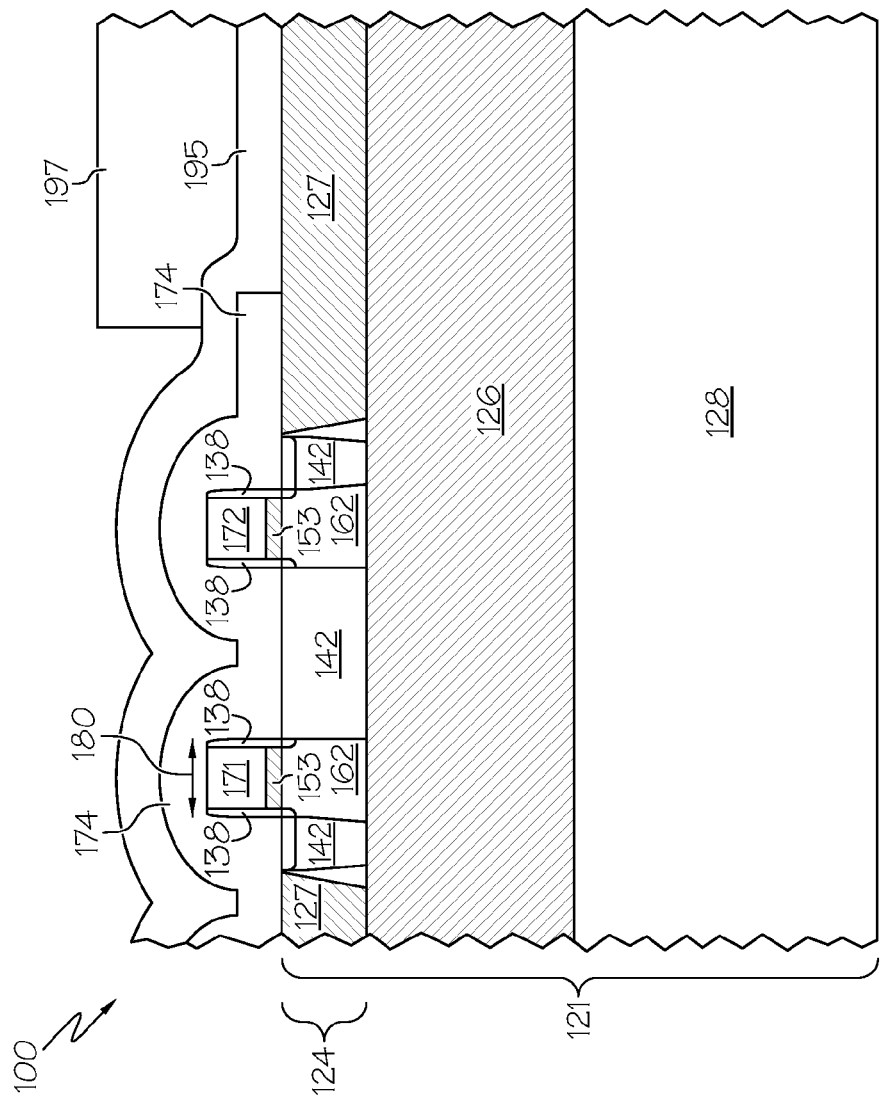

As illustrated in FIG. 8, a layer of masking material 197, which can be, for example, a layer of photoresist, is applied and patterned to form a patterned mask 197 which exposes portions the tensile stress layer 195 which overlie at least the active regions 142, 162. Using this layer of patterned mask material 197 as an etch mask, the exposed portion of the tensile stress layer 175 are then removed. After removing the layer of patterned mask material 197, the resulting structure is illustrated in FIG. 9, which illustrates a cross sectional view taken along line 9-9' of FIG. 2.

Figure 9:
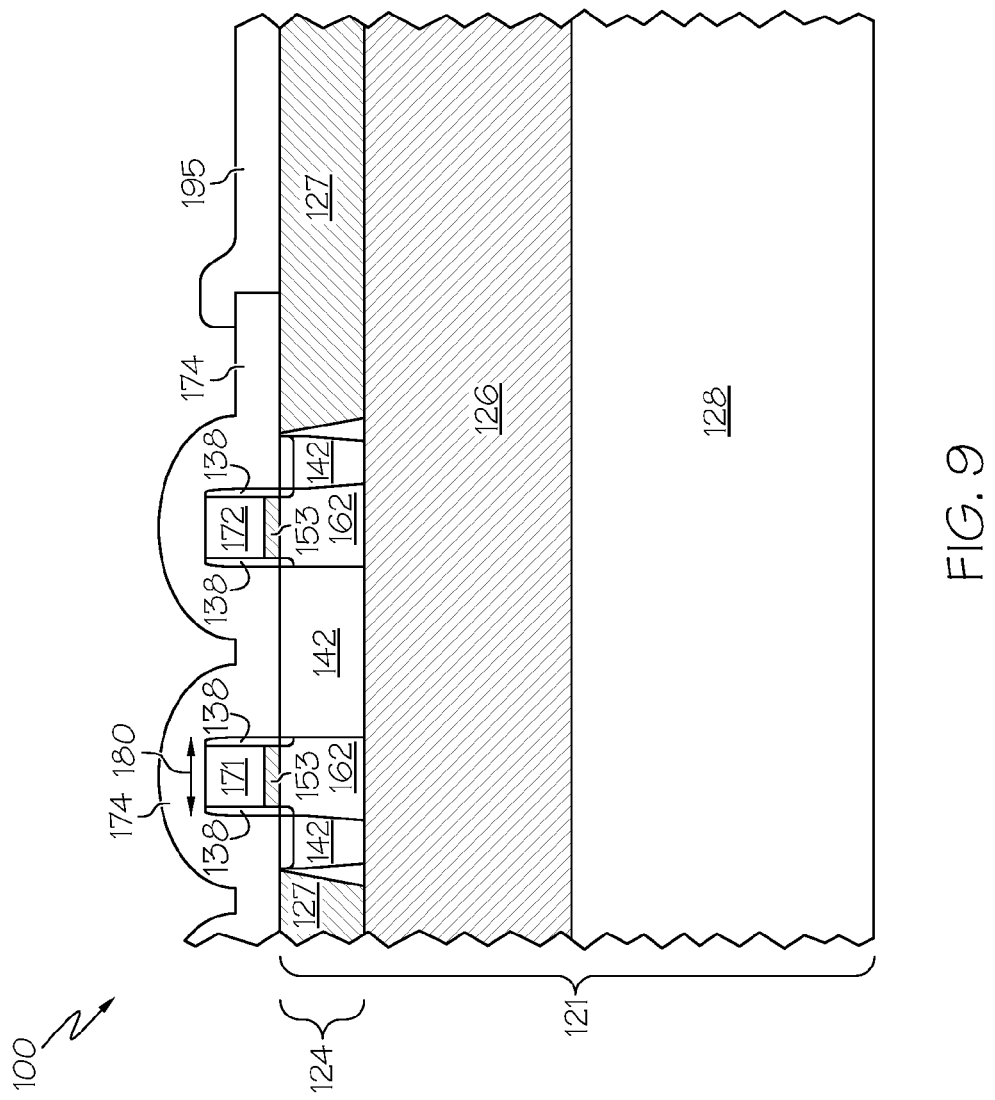

Although not shown in FIG. 9, the stress enhanced PMOS device 100 can be completed in conventional manner. Conventional steps include, for example, forming metal silicide contacts on the source and drain regions 142, 144, depositing interlayer dielectric layers, planarizing the interlayer dielectric layers, and etching contact vias or openings through the dielectric layer to the metal silicide contacts. Electrical contact to the source and drain regions 142, 144 and the gate electrodes 171,172 can then be made by contact plugs formed in contact openings and by interconnect metal deposition and patterning.

Although the embodiments described above relate to fabrication of a PMOS device, similar techniques can be used to improve performance of an NMOS device. In such embodiments, the semiconductor layer can be doped with P-type conductivity determining impurities to create P-well regions (not shown) in the semiconductor layer 124. Source and drain regions can be formed for the NMOS transistor (not shown) and N-type conductivity determining ions (e.g., phosphorus or arsenic ions) can be implanted into exposed portions of each P-well region. In these alternative embodiments, because an NMOS transistor is formed in the active region, the first-type stress is a tensile stress, and the second-type stress is a compressive stress. The compressive stress layer reduces the mobility of majority charge-carrier electrons through the channel region of the NMOS transistor to reduce drive current especially with respect to the gate electrodes which it is in closest proximity to. The compressive stress layer can be formed of an electrically insulating material, such as, a layer of stressed silicon nitride (SiN). By decreasing stress in channel, the drive current capability of the NMOS transistor can be reduced, and if channel stress is decreased enough, the active width can be increased without changing drive current capability of the NMOS transistor. As such, the active width of the transistor can be increased to avoid corner rounding problems without violating drive current requirements. As above, the gate length and maximum dimension of the active region are not increased, and therefore overall layout area of the NMOS transistor is also not increased.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A stress enhanced semiconductor device, comprising:
a substrate comprising an inactive region and an active region, wherein the active region comprises: a first lateral edge which defines a first width of the active region, a second lateral edge which defines a second width of the active region, wherein the first width is greater than the second width;
a tensile stress layer overlying the active region and applying a tensile stress to the active region; and
a compressive stress layer overlying a portion of the tensile stress layer, overlying at least a portion of the inactive region, and disposed adjacent the second lateral edge of the active region and outside the active region.

2. A semiconductor device according to claim 1, wherein the compressive stress layer applies a compressive stress to the tensile stress layer and decreases the tensile stress of the tensile stress layer overlying the active region to decrease drive current in the active region.

3. A semiconductor device according to claim 1, further comprising:
a first gate electrode overlying the active region and having a first active width;
a second gate electrode overlying the active region and having a second active width, wherein the active region further comprises:
a first portion comprising the first lateral edge having the first width, wherein the first gate electrode overlies the first portion; and
a second portion comprising the second lateral edge having the second width, wherein the second gate electrode overlies the second portion.

4. A semiconductor device according to claim 3, wherein the active region comprises:
a fillet portion, integral with the first portion and the second portion, wherein the active region has a third width defined by the fillet portion which ranges between the first width to the second width.

5. A semiconductor device according to claim 4, wherein the first gate electrode and the second gate electrode are non-overlapping with the fillet portion.

6. A semiconductor device according to claim 1, wherein the compressive stress layer disposed adjacent the tensile stress layer, and wherein the compressive stress layer is spaced apart from the active region.

7. A semiconductor device according to claim 1, wherein the first width is between 0.6 µm and 1.0 µm, and, wherein the second width is between 0.2 µm and 0.5 µm, and wherein the compressive stress layer is spaced apart from the active region by a distance between 0.02 and 0.2 µm.

8. A stress enhanced semiconductor device, comprising:
a substrate comprising:
an inactive region having a substantially planar surface; and
an active region, comprising: a first portion comprising a first lateral edge which defines a first width of the active region, a second portion comprising a second lateral edge which defines a second width of the active region, wherein the first width is greater than the second width, and a fillet portion, integral with the first portion and the second portion, wherein the active region has a third width defined by the fillet portion which ranges between the first width to the second width;
a first gate electrode overlying the first portion of the active region and having a first active width;
a second gate electrode overlying the second portion of the active region and having a second active width, wherein the first gate electrode and the second gate electrode are non-overlapping with the fillet portion;
a first-type stress layer overlying the substrate and the active region of the substrate; and
a second-type stress layer disposed adjacent the second lateral edge of the active region and spaced apart from the active region, wherein the first-type stress is opposite the second-type stress, and wherein the second-type stress layer overlies the substrate and at least a portion of the inactive region of the substrate and overlaps with a portion of the first-type stress layer and decreases first-type stress of the first-type stress layer overlying the active region to decrease drive current in the active region.

9. A semiconductor device according to claim 8, wherein the first-type stress is tensile, and wherein the second stress-type is compressive.

10. A semiconductor device according to claim 8, wherein the first-type stress is compressive, and wherein the second stress-type is tensile.

11. A semiconductor device according to claim 8, wherein the first width is between 0.6 µm and 1.0 µm, and, wherein the second width is between 0.2 µm and 0.5 µm, and wherein the second-type stress layer is spaced apart from the active region by a distance (185) of at least 0.02 and 0.2 µm.

12. A stress enhanced semiconductor device, comprising:
a substrate comprising an inactive region and an active region, wherein the active region comprises: a first lateral edge which defines a first width of the active region, a second lateral edge which defines a second width of the active region, wherein the first width is greater than the second width;
a compressive stress layer overlying the active region and applying a compressive stress to the active region; and
a tensile stress layer overlying only a portion of the compressive stress layer that does not overlap with the active region, wherein the tensile stress layer applies a tensile stress to the compressive stress layer to decrease compressive stress of the compressive stress layer overlying the active region to decrease drive current in the active region, the tensile stress layer overlying at least a portion of the inactive region, and the tensile stress layer disposed adjacent the second lateral edge of the active region and outside the active region.

13. A semiconductor device according to claim 12, further comprising:
a first gate electrode overlying the active region and having a first active width;
a second gate electrode overlying the active region and having a second active width, wherein the active region further comprises:
a first portion comprising the first lateral edge having the first width, wherein the first gate electrode overlies the first portion; and a second portion comprising the second lateral edge having the second width, wherein the second gate electrode overlies the second portion.

14. A semiconductor device according to claim 13, wherein the active region comprises:

a fillet portion, integral with the first portion and the second portion, wherein the active region has a third width defined by the fillet portion which ranges between the first width to the second width.

15. A semiconductor device according to claim 14, wherein the first gate electrode and the second gate electrode are non-overlapping with the fillet portion.

16. A semiconductor device according to claim 12, wherein the tensile stress layer disposed adjacent the compressive stress layer, and wherein the tensile stress layer is spaced apart from the active region.

17. A semiconductor device according to claim 12, wherein the first width is between 0.6 μm and 1.0 μm, and, wherein the second width is between 0.2 μm and 0.5 μm, and wherein the tensile stress layer is spaced apart from the active region by a distance between 0.02 and 0.2 μm.

\* \* \* \* \*